United States Patent
Manousakis et al.

(10) Patent No.: US 12,200,907 B2
(45) Date of Patent: Jan. 14, 2025

(54) SYSTEMS AND METHODS FOR CENTRALIZED AND SCALABLE VAPOR MANAGEMENT SYSTEM IN IMMERSION COOLING

(71) Applicant: Microsoft Technology Licensing, LLC, Redmond, WA (US)

(72) Inventors: Ioannis Manousakis, Redmond, WA (US); Eric Clarence Peterson, Woodinville, WA (US); Husam Atallah Alissa, Redmond, WA (US); Nicholas Andrew Keehn, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 205 days.

(21) Appl. No.: 18/009,951

(22) PCT Filed: Jun. 10, 2021

(86) PCT No.: PCT/US2021/036857
§ 371 (c)(1),
(2) Date: Dec. 12, 2022

(87) PCT Pub. No.: WO2021/252789
PCT Pub. Date: Dec. 16, 2021

(65) Prior Publication Data
US 2023/0232584 A1    Jul. 20, 2023

(30) Foreign Application Priority Data
Jun. 10, 2020  (NL) .................................... 2025803

(51) Int. Cl.
*H05K 7/20* (2006.01)

(52) U.S. Cl.
CPC ......... *H05K 7/203* (2013.01); *H05K 7/20318* (2013.01); *H05K 7/20809* (2013.01); *H05K 7/20818* (2013.01); *H05K 7/20827* (2013.01)

(58) Field of Classification Search
None
See application file for complete search history.

(56) References Cited

U.S. PATENT DOCUMENTS 7,556,089 B2 *  7/2009  Bhatti ................... F28D 7/024
                                                165/80.4
10,765,033 B1 * 9/2020  Keehn ............... H05K 7/20327
(Continued)

FOREIGN PATENT DOCUMENTS

CN     110366359 A    10/2019

OTHER PUBLICATIONS

"Search Report Issued in Netherlands Patent Application No. N2025803", Mailed Date: Mar. 24, 2021, 14 Pages.
(Continued)

*Primary Examiner* — Xanthia C Relford
*Assistant Examiner* — Xanthia C Cunningham
(74) *Attorney, Agent, or Firm* — RAY QUINNEY & NEBEKER P.C.; Paul N. Taylor

(57) ABSTRACT

A thermal management system includes a boiler tank and at least one heat-generating component positioned in the boiler tank. The boiler tank is in fluid communication with a vapor return line and a liquid return line. A condenser is in fluid communication with the vapor return line and the liquid return line. The condenser is positioned between vapor return line and the liquid return line in the fluid communication.

20 Claims, 5 Drawing Sheets

(56) References Cited

U.S. PATENT DOCUMENTS

| | | | | |
|---|---|---|---|---|
| 2010/0328891 A1* | 12/2010 | Campbell | ......... | H05K 7/20318 |
| | | | | 165/104.33 |
| 2011/0315343 A1* | 12/2011 | Campbell | ............. | H05K 7/203 |
| | | | | 165/80.3 |
| 2013/0118710 A1* | 5/2013 | Chen | ..................... | F28D 15/00 |
| | | | | 165/104.11 |
| 2014/0216686 A1 | 8/2014 | Shelnutt et al. | | |
| 2014/0218861 A1* | 8/2014 | Shelnutt | ............ | H05K 7/20818 |
| | | | | 361/679.53 |
| 2015/0237767 A1* | 8/2015 | Shedd | ..................... | F28F 3/12 |
| | | | | 165/104.31 |
| 2016/0044833 A1 | 2/2016 | Krishnan et al. | | |
| 2017/0325355 A1* | 11/2017 | Lau | .................. | H05K 7/20381 |
| 2018/0020573 A1* | 1/2018 | Bouras | .............. | H05K 7/20381 |
| 2019/0159360 A1 | 5/2019 | Uchida | | |
| 2019/0166725 A1 | 5/2019 | Jing et al. | | |
| 2019/0390603 A1* | 12/2019 | Snyder | .................. | H05K 7/203 |
| 2020/0084918 A1 | 3/2020 | Shen et al. | | |

OTHER PUBLICATIONS

"International Search Report and Written Opinion Issued in PCT Application No. PCT/US21/036857", Mailed Date: Sep. 15, 2021, 19 Pages.

\* cited by examiner

SYSTEMS AND METHODS FOR CENTRALIZED AND SCALABLE VAPOR MANAGEMENT SYSTEM IN IMMERSION COOLING

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Liquid cooling can effectively cool components as liquid cooling fluids have more thermal mass than air or gas cooling. The liquid cooling fluid can be maintained at a lower temperature by allowing vaporized fluid to rise out of the liquid. The vapor in the cooling liquid can adversely affect the cooling performance of the cooling fluid. The vapor can be condensed and returned to the boiler tank.

BRIEF SUMMARY

In some embodiments, a thermal management system includes a boiler tank and at least one heat-generating component positioned in the boiler tank. The boiler tank is in fluid communication with a vapor return line and a liquid return line. A condenser is in fluid communication with the vapor return line and the liquid return line. The condenser is positioned between vapor return line and the liquid return line in the fluid communication.

In some embodiments, a method of installing a thermal management system for computing devices includes providing a thermal management system including a boiler tank and at least one heat-generating component positioned in the boiler tank. The boiler tank is in fluid communication with a vapor return line and a liquid return line. A condenser is in fluid communication with the vapor return line and the liquid return line. The condenser is positioned between vapor return line and the liquid return line in the fluid communication. The method further includes connecting a second boiler tank to the vapor return line, the second boiler tank having at least one heat-generating component positioned in the second boiler tank, connecting the second boiler tank to a cooling fluid storage tank in fluid communication with the liquid return line, and filling a portion of the boiler tank with liquid cooling fluid from the cooling fluid storage tank.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to systems and methods for thermal management of electronic devices or other heat-generating components. Immersion chambers surround the heat-generating components with a liquid cooling fluid, which conducts heat from the heat-generating components to cool the heat-generating components. As the cooling fluid absorbs heat from the heat-generating components, the temperature of the cooling fluid increases and the cooling fluid may vaporize, introducing vapor into the liquid of the cooling fluid.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a plurality of boiler tanks connected in parallel along a shared fluid connection. The boiler tanks share one or more condensers for condensing the vapor cooling fluid back into a liquid state. With boiler tanks arranged in parallel on a shared fluid connection, one or more boiler tanks may be connected or disconnected from the shared fluid connection (e.g., removed, added, moved, repaired, replaced) without interrupting the operations of the condenser(s). In some embodiments, increased operation load and vapor generation of a first boiler tank is shared across the immersion cooling system. In some embodiments, condensers can operate at an improved efficiency by adjusting the quantity of condensers operating on the shared fluid connection relative to conventional dedicated condensers positioned in or on each of the boiler tanks.

Figure 1:
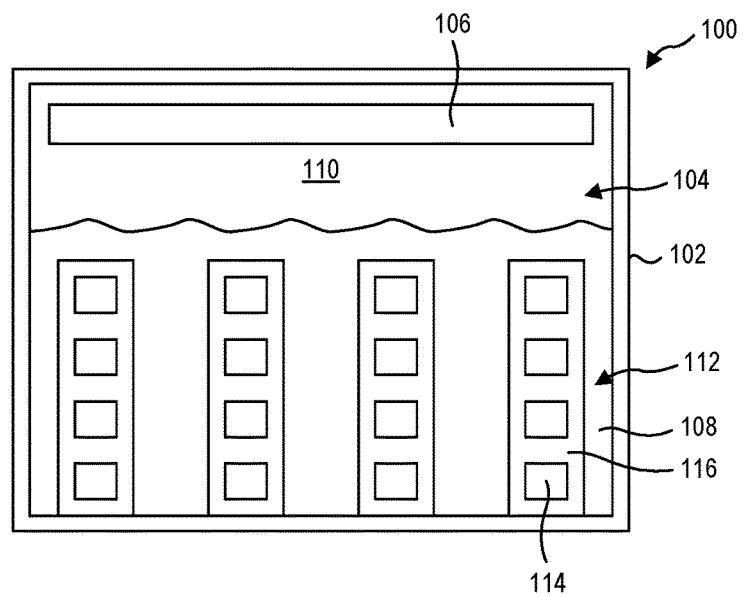
FIG. 1 is a side schematic representation of an immersion cooling system, according to at least one embodiment of the present disclosure.

An immersion cooling system 100, shown in FIG. 1, includes a boiler tank 102 containing an immersion chamber 104 and a condenser 106 in the immersion chamber 104. The immersion chamber 104 contains a cooling fluid that has a liquid cooling fluid 108 portion and a vapor cooling fluid 110 portion. The liquid cooling fluid 108 creates an immersion bath 112 in which a plurality of heat-generating components 114 are positioned to heat the liquid cooling fluid 108.

Figure 2:
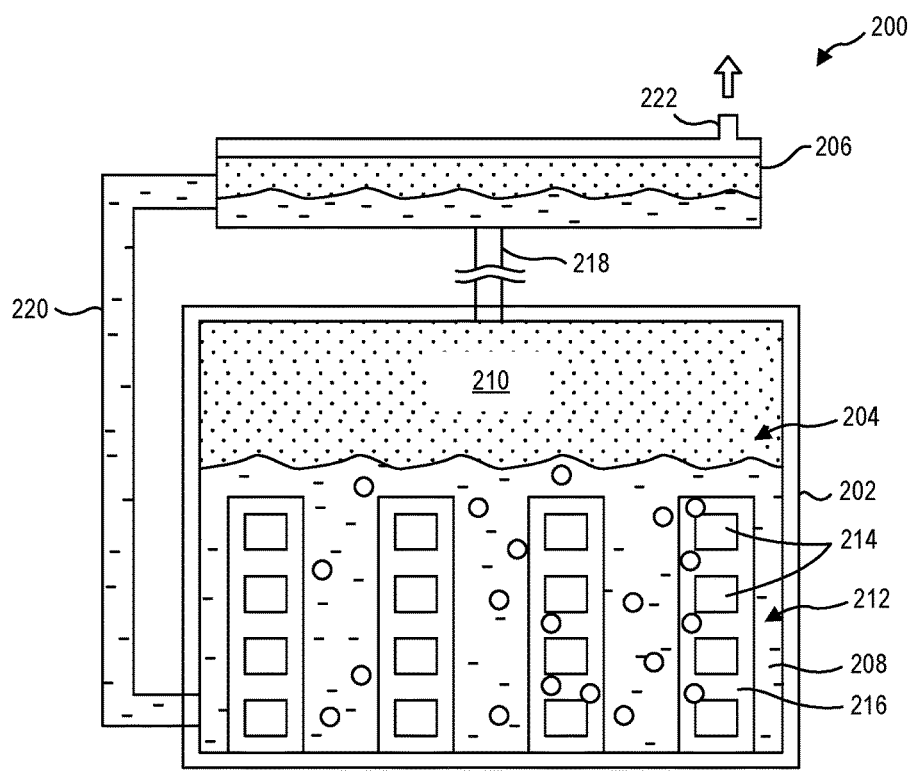
FIG. 2 is a side schematic representation of an immersion cooling system with an external condenser, according to at least one embodiment of the present disclosure.

Referring now to FIG. 2, an immersion cooling system 200 according to the present disclosure includes a boiler tank 202 defining a chamber 204 with a cooling fluid positioned therein. The cooling fluid transitions between a liquid cooling fluid 208 phase and a vapor cooling fluid 210 phase to remove heat from hot or heat-generating components 214 in the chamber 204. The liquid cooling fluid 208 more efficiently receives heat from the heat-generating components 214 and, upon transition to the vapor cooling fluid 210, the vapor cooling fluid 210 can be cooled and condensed to extract the heat from the cooling fluid before the liquid cooling fluid 208 is returned to the liquid immersion bath 212.

In some embodiments, the liquid immersion bath 212 has a plurality of heat-generating components 214 positioned in the liquid cooling fluid 208. The liquid cooling fluid 208 surrounds the heat-generating components 214 and other objects or parts attached to the heat-generating components 214. In some embodiments, the heat-generating components 214 are positioned in the liquid cooling fluid 208 on one or more supports 216. The supports 216 may support one or more heat-generating components 214 in the liquid cooling fluid 208 and allow the liquid cooling fluid 208 to move around the heat-generating components 214. In some embodiments, a support 216 is thermally conductive to conduct heat from the heat-generating components 214. The support(s) 216 may increase the effective surface area from which the liquid cooling fluid 208 may remove heat through convective cooling. In some embodiments, one or more of the heat-generating components 214 includes a heat sink or other device attached to the heat-generating component 214 to conduct away thermal energy and effectively increase the surface area of the heat-generating component 214.

As described, conversion of the liquid cooling fluid 208 to a vapor phase requires the input of thermal energy to overcome the latent heat of vaporization and may be an effective mechanism to increase the thermal capacity of the cooling fluid and remove heat from the heat-generating components. Because the vapor rises in the liquid cooling fluid 208, the vapor cooling fluid 210 can be extracted from the chamber 204 in an upper vapor region of the chamber. A condenser 206 cools part of the vapor cooling fluid 210 back into a liquid cooling fluid 208, removing thermal energy from the system and reintroducing the cooling fluid 208 into the liquid immersion bath 212. The condenser 206 radiates or otherwise dumps the thermal energy from the cooling fluid into the ambient environment or into a conduit to carry the thermal energy away from the cooling system.

In conventional immersion cooling systems, the condenser is integrated into the boiler tank and/or the chamber to efficiently remove thermal energy from the cooling fluid. In some embodiments according to the present disclosure, an immersion cooling system 200 for thermal management of computing devices allows a plurality of boiler tanks 202 and/or chambers 204 to be connected to and in fluid communication with an external condenser 206. In some embodiments, an immersion cooling system includes a vapor return line 218 and a liquid return line 220 that connect the boiler tank 202 to the condenser 206 and allow vapor cooling fluid 210 to enter the condenser 206 from the boiler tank 202 and/or chamber 204 and allow liquid cooling fluid 208 to return to the boiler tank 202 and/or chamber 204.

The vapor return line 218 may be colder than the boiling temperature of the cooling fluid. In some embodiments, a portion of the vapor cooling fluid condenses in the vapor return line 218. The vapor return line 218 can, in some embodiments, be oriented at an angle such that the vapor return line 218 is non-perpendicular to the direction of gravity. The condensed cooling fluid can then drain either back to the boiler tank 202 or forward to the condenser 206 depending on the direction of the vapor return line 218 slope. In some embodiments, the vapor return line 218 includes a liquid collection line or valve, like a bleeder valve, that allows the collection and/or return of the condensed cooling fluid to the boiler tank 202 or condenser 206.

In some embodiments, the liquid cooling fluid 208 receives heat in a cooling volume of cooling fluid immediately surrounding the heat-generating components 214. The cooling volume is the region of the cooling fluid (including both liquid and vapor phases) that is immediately surrounding the heat-generating components 214 and is responsible for the convective cooling of the heat-generating components 214. In some embodiments, the cooling volume is the volume of cooling fluid within 5 millimeters (mm) of the heat-generating components 214. In some embodiments, the cooling volume is the volume of cooling fluid within 5 mm of the vertical stacks (supports 216 and heat-generating components 214). In some embodiments, the cooling volume is defined by a vertical cylinder around each of the vertical stacks where no portion of the cylinder is outside 5 mm of the heat-generating components.

The cooling fluid has a boiling temperature below a critical temperature at which the heat-generating components experience thermal damage. For example, the heat-generating components may be computing components that experience damage above 100° Celsius (C). In some embodiments, the boiling temperature of the cooling fluid is less than about 90° C. In some embodiments, the boiling temperature of the cooling fluid is less than about 80° C. In some embodiments, the boiling temperature of the cooling fluid is less than about 70° C. In some embodiments, the boiling temperature of the cooling fluid is less than about 60° C. In some embodiments, the boiling temperature of the cooling fluid is at least about 35° C. In some embodiments, the cooling fluid includes water. In some embodiments, the cooling fluid includes glycol. In some embodiments, the cooling fluid includes a combination of water and glycol. In some embodiments, the cooling fluid is an aqueous solution. In some embodiments, the cooling fluid is an electronic liquid, such as FC-72 available from 3M, or similar non-conductive fluids. In some embodiments, the heat-generating components, supports, or other elements of the immersion cooling system positioned in the cooling fluid have nucleation sites on a surface thereof that promote the nucleation of vapor bubbles of the cooling fluid at or below the boiling temperature of the cooling fluid.

Figure 3:
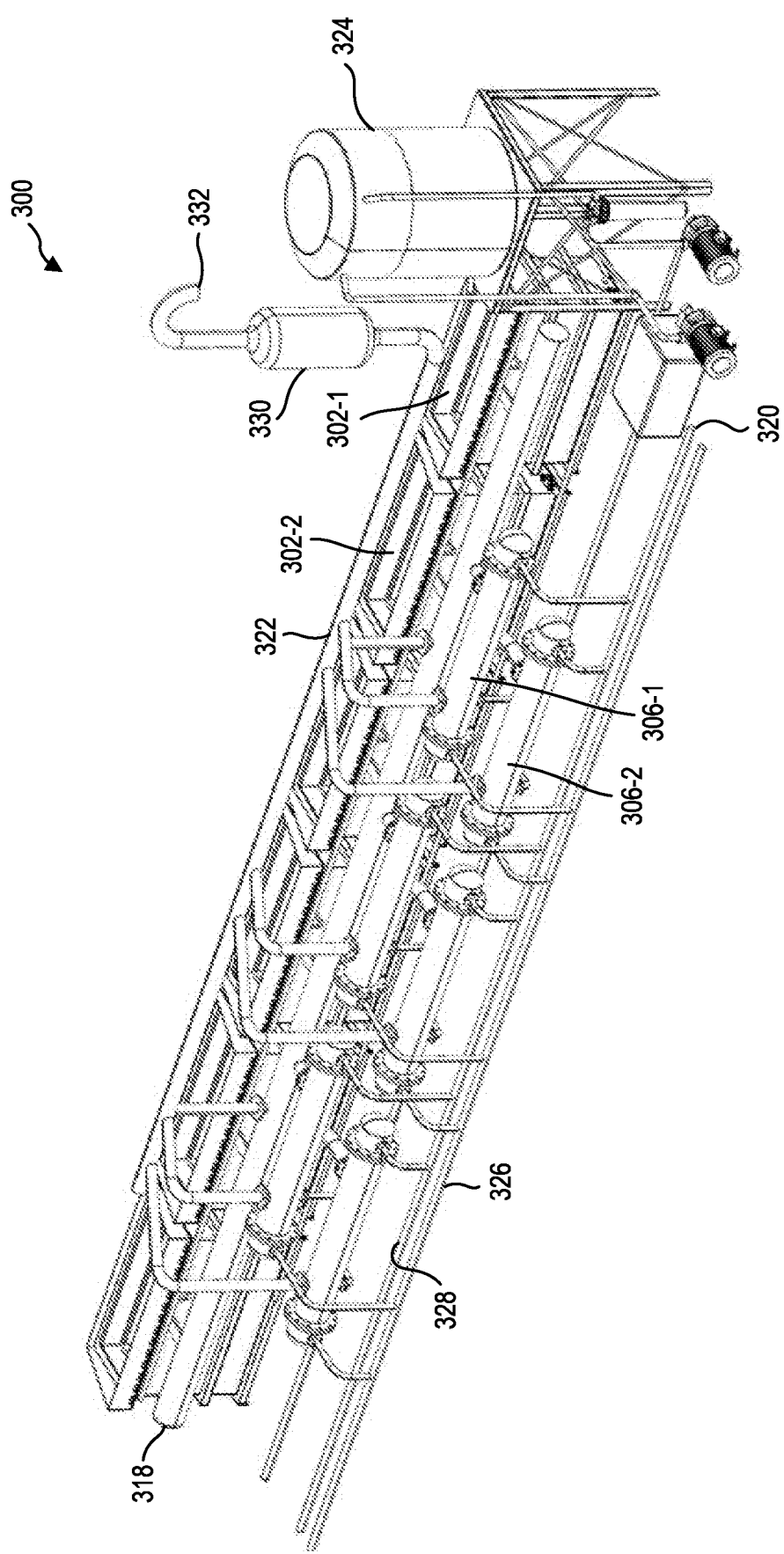
FIG. 3 is a perspective view of an immersion cooling system with a plurality of boiler tanks, according to at least one embodiment of the present disclosure.

Referring now to FIG. 3, in some embodiments of an immersion cooling system 300, a plurality of boiler tanks 302-1, 302-1 is connected to a shared vapor return line 318 and/or shared liquid return line 320, which are in turn connected to at least one shared condenser 306-1, 306-2, providing redundancy and scalability in the immersion capacity of the immersion cooling system 300. In some embodiments, the vapor return line 318 and liquid return line 320 are connected to a plurality of condensers 306-1, 306-2, providing redundancy and scalability in the condensing capacity of the immersion cooling system 300.

In embodiments of immersion cooling systems with heat-generating components including computing components, similar computing components can be aggregated into stacks or series. For example, a first series of heat-generating components may be graphical processing units (GPUs) and a second series of heat-generating components may be central processing units (CPUs). In other examples, a first immersion cooling system houses GPUs and a second immersion cooling system houses CPUs.

In some embodiments, similar computing components can be aggregated into individual boiler tanks of the plurality of boiler tanks 302-1, 302-2. For example, a first boiler tank 302-1 may contain graphical processing units (GPUs) and a second boiler tank 302-2 may contain central processing units (CPUs). The first boiler tank 302-1 and the second boiler tank 302-2 may be connected to and in fluid communication with the shared vapor return line 318 and/or shared liquid return line 320.

In some embodiments, the cooling fluid is therefore shared between each of the boiler tanks 302-1, 302-2 in the immersion cooling system 300. The vapor cooling fluid from each of the boiler tanks 302-1, 302-2 is provided to the condenser(s) 306-1, 306-2 via the vapor return line 318. In some embodiments, the condenser(s) 306-1, 306-2 is a solid-state condenser, such as a Peltier cooler. In some embodiments, the condenser 306-1, 306-2 uses a second cooling fluid to cool the coils or other cooling surface of the condenser 306-1, 306-2. For example, a condenser 306-1, 306-2 has a coolant intake line 326 and a coolant outlet line 328 that cool an interior space of the condenser 306-1, 306-2. The condenser 306-1, 306-2 cools the vapor cooling fluid to condense the cooling fluid into the liquid phase, which is subsequently returned to the boiler tanks 302-1, 302-2. In some embodiments, the second cooling fluid includes water. In some embodiments, the second cooling fluid includes glycol. In some embodiments, the second cooling fluid includes a combination of water and glycol. In some embodiments, the second cooling fluid is an aqueous solution.

In some embodiments, the external condenser(s) 306-1, 306-2 allows the removal, addition, movement, repair, or replacement of a first boiler tank 302-1 without affecting the operation of a second boiler tank 302-2. In some embodiments, the removal, addition, movement, repair, or replacement of the first boiler tank uses a cooling fluid storage tank 324. The cooling fluid storage tank 324 can temporarily hold and/or selectively dispense cooling fluid to one or more boiler tanks 302-1, 302-2. In some embodiments, a boiler tank is drained 302-1, 302-2 into the cooling fluid storage tank 324 and/or the cooling fluid storage tank 324 can withhold dispensing cooling fluid to a boiler tank 302-1, 302-2 to allow draining of the boiler tank 302-1, 302-2. The drained boiler tank 302-1, 302-2 can be subsequently disconnected from the vapor return line 318 and the liquid return line 320 to remove the boiler tank 302-1, 302-2 from the immersion cooling system 300 without interfering with or compromising the operation of other boiler tanks 302-1, 302-2 in the immersion cooling system 300.

In some embodiments, the cooling fluid storage tank 324 stores cooling fluid that may be dispensed to a boiler tank 302-1, 302-2 when the boiler tank 302-1, 302-2 is connected to the vapor return line 318 and liquid return line 320 to add the boiler tank 302-1, 302-2 to the immersion cooling system 300 without interfering with or compromising the operation of other boiler tanks 302-1, 302-2 in the immersion cooling system 300. In some embodiments, the cooling fluid storage tank 324 can receive and temporarily hold cooling fluid from a boiler tank 302-1, 302-2 while the boiler tank 302-1, 302-2 is moved, repaired, or replaced, and the cooling fluid storage tank 324 can return the liquid cooling fluid to the boiler tank 302-1, 302-2 after movement, repair, or replacement is complete.

In some embodiments, at least one of the boiler tanks 302-1, 302-2 includes a drain line with a fluid filter thereon to clean fluid from the boiler tank(s) 302-1, 302-2. In some embodiments, the clean cooling fluid is passed through the filter and into the liquid return line 320 to be returned to the boiler tank(s) 302-1, 302-2. The clean cooling fluid is, in some embodiments, passed through the filter into the cooling fluid storage tank 324 to be returned to the boiler tank(s) 302-1, 302-2.

In some embodiments, the cooling fluid storage tank 324 is positioned in fluid communication with both the liquid return line 320 from the condenser(s) and the plurality of boiler tanks 302-1, 302-2. The cooling fluid storage tank 324 may be connected in fluid communication in parallel with the boiler tanks 302-1, 302-2 to receive overflow cooling fluid during removal, addition, movement, repair, or replacement of boiler tanks 302-1, 302-2. In some embodiments, the cooling fluid storage tank 324 is connected in fluid communication in series between the condenser(s) 306-1, 306-2 and the boiler tanks 302-1, 302-2 in the liquid return line 320.

In some embodiments, the immersion cooling system is a closed circulation system in which only cooling fluid (in either vapor or liquid phase) is contained in the boiler tanks, vapor return line, liquid return line, condenser(s), and cooling fluid storage tank. During the removal, addition, movement, repair, or replacement of a boiler tank, non-condensable fluid (such as air) may be introduced into the immersion cooling system. It should be understood that a non-condensable fluid is a fluid that is not condensable at or near room temperature and pressure. For example, while nitrogen can be condensed into a liquid phase, such condensation will not occur until −196° C., and as such would be considered non-condensable in the present system. In some embodiments, a non-condensable fluid is any fluid that condenses below the condensation temperature of the cooling fluid.

In some embodiments, a non-condensable vent line 322 is in fluid communication with the condenser(s) 306-1, 306-2 to allow the non-condensable fluid to vent from the system. In some embodiments, the vapor cooling fluid is denser than a non-condensable fluid in the condenser 306-1, 306-2. The non-condensable fluid rises relative to the vapor cooling fluid and is separated from the vapor cooling fluid. The non-condensable fluid is removed via the non-condensable vent line 322.

In some embodiments, the non-condensable vent line 324 includes a filter 330 in the non-condensable vent line 322 prior to an outlet 332. The filter 330 can prevent impurities or pollutants, such as particulates, from being exhausted from the outlet 332. In some embodiments, the non-condensable vent line 322 includes a vent line condenser that operates at a lower temperature than the condenser(s) 306-1, 306-2 of the immersion cooling system 300. In the event that a portion of the vapor cooling fluid in not condensed in the condenser(s) 306-1, 306-2, the vent line condenser can, therefore, condense at least a portion of the uncondensed vapor cooling fluid and limit and/or prevent cooling fluid from being exhausted from the outlet 332.

In some embodiments, an immersion cooling system 300 includes a plurality of boiler tanks 302-1, 302-2 and a plurality of condensers 306-1, 306-2. In some embodiments, an immersion cooling system 300 includes a different quantity of boiler tanks 302-1, 302-2 than condensers 306-1, 306-2. In some embodiments, an immersion cooling system 300 includes more boiler tanks 302-1, 302-2 than condensers 306-1, 306-2, providing greater efficiency by condensing the vapor cooling fluid of the boiler tanks 302-1, 302-2 with relatively fewer condensers 306-1, 306-2. In some embodiments, an immersion cooling system 300 includes more condensers 306-1, 306-2 than boiler tanks 302-1, 302-2, providing redundancy by ensuring condensing capacity is not adversely affected by a failure of a condenser 306-1, 306-2. In some embodiments, an immersion cooling system 300 includes a quantity of condensers 306-1, 306-2 equal to the quantity of boiler tanks 302-1, 302-2 plus one extra condenser 306-1, 306-2 to provide backup capacity. An immersion cooling system 300 with redundant condenser capacity on a shared vapor return line 318 and/or shared liquid return line 320 may maintain condenser capacity in the event of a condenser failure irrespective of which condenser 306-1, 306-2 fails.

Figure 4:
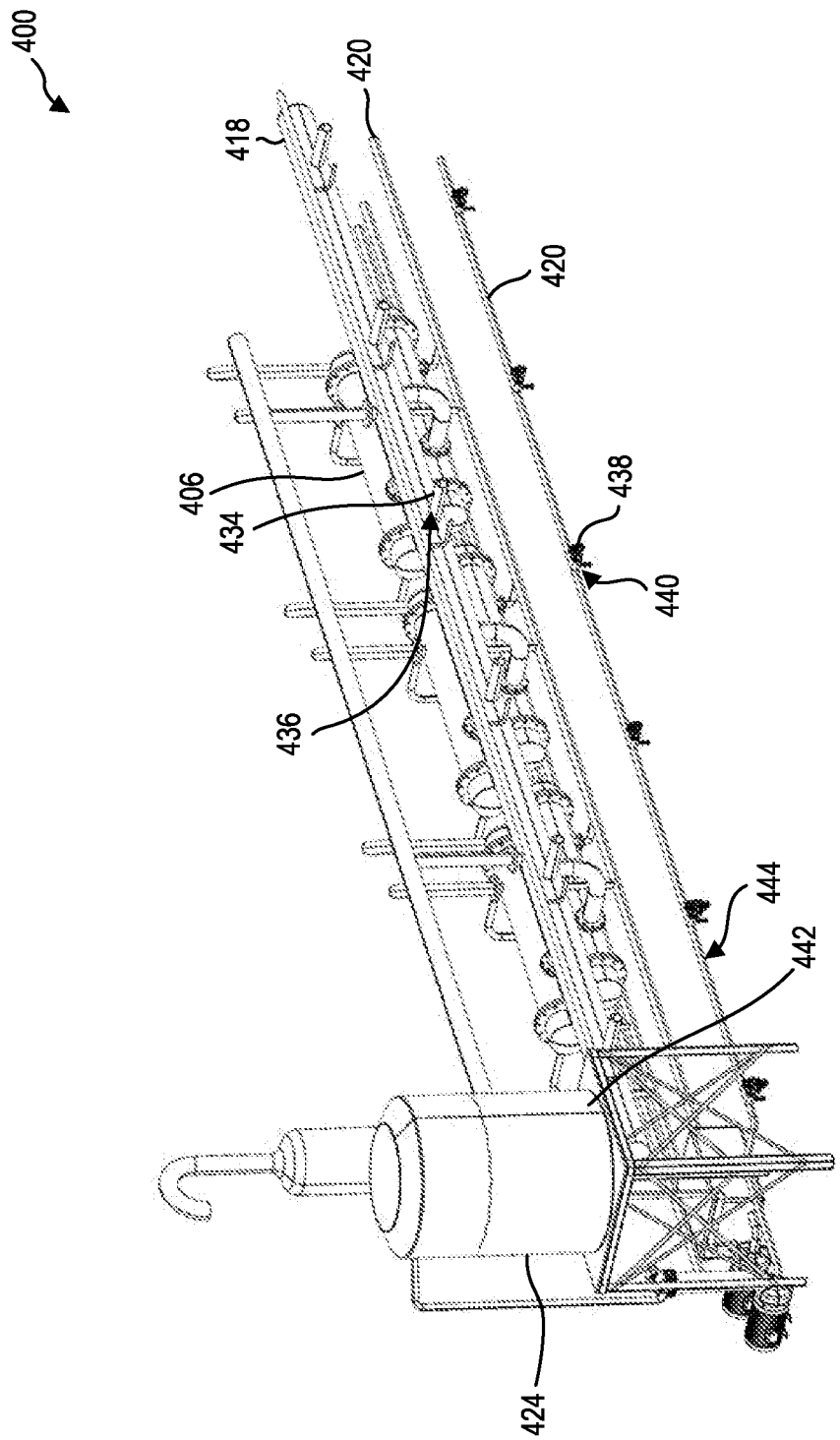
FIG. 4 is a perspective view of an immersion cooling system with a shared vapor return line and liquid return line, according to at least one embodiment of the present disclosure.

FIG. 4 illustrates an embodiment of an immersion cooling system 400 without the boiler tank(s) connected. In some embodiments, the shared vapor return line 418 and/or shared liquid return line 420 include a plurality of valves at or near a connection to the plurality of boiler tanks. The valves may allow a connection to a boiler tank to be closed prior to the removal, addition, movement, repair, or replacement of the boiler tank. By closing the connection(s) to the boiler tank before removal, addition, movement, repair, or replacement of a boiler tank, the likelihood of introducing non-condensable vapor or other contaminants into the vapor return line 418, liquid return line 420, or other portions of the immersion cooling system 400 is reduced.

In some embodiments, a vapor connection 434 of the vapor return line 418 to the boiler tank (such as the boiler tanks 302-1, 302-2 of FIG. 3) includes a vapor return line connection valve 436. The vapor return line connection valve 436 regulates a flow of vapor cooling fluid from a boiler tank to the vapor return line 418. In some embodiments, each vapor connection 434 of the vapor return line 418 has a vapor return line connection valve 436. Closing the vapor return line connection valve 436 limits and/or prevents the flow of vapor cooling fluid from the vapor connection 434 to the vapor return line 418. After closing the vapor return line connection valve 436, a boiler tank can be removed while introducing less or no non-condensable fluid into the vapor return line 418.

In some embodiments, a liquid connection 438 of the liquid return line 420 to the boiler tank includes a liquid return line connection valve 440. The liquid return line connection valve 440 regulates a flow of liquid cooling fluid from the liquid return line 420 to the boiler tank. In some embodiments, each liquid connection 438 of the liquid return line 420 has a liquid return line connection valve 440. Closing the liquid return line connection valve 440 limits and/or prevents the flow of liquid cooling fluid through the liquid connection 438 from the liquid return line 420. After closing the liquid return line connection valve 440, a boiler tank can be removed while allowing less or no cooling fluid to flow from the liquid return line 420.

In some embodiments, a cooling fluid storage tank connection 442 of the liquid return line 420 to the cooling fluid storage tank 424 includes a storage tank connection valve 444. The storage tank connection valve 444 regulates a flow of liquid cooling fluid from the storage tank 424 to the boiler tanks. FIG. 4 illustrates an embodiment of an immersion cooling system 400 with a single cooling fluid storage tank connection 442 that provides fluid communication to the remainder of the liquid return line 420 and to the liquid connections 438. In some embodiments, the cooling fluid storage tank 424 has a plurality of cooling fluid storage tank connections 442 that each provide dedicated liquid return lines 420 and/or liquid connections 438 to the plurality of boiler tanks. In some embodiments, each cooling fluid storage tank connection 442 of the storage tank 424 has a storage tank connection valve 444. Closing the storage tank connection valve 444 limits and/or prevents the flow of liquid cooling fluid from the storage tank connection 442 to the liquid return line 420. After closing the storage tank connection valve 444, a cooling fluid storage tank 424 can be removed while allowing less or no cooling fluid to flow from the liquid return line 420.

In some embodiments, an immersion cooling system according to the present disclosure allows the removal, addition, movement, repair, or replacement of a boiler tank and/or a condenser from the system without adversely impacting other components. In some embodiments, the removal, addition, movement, repair, or replacement of a boiler tank can be performed without altering the operation of any of the condensers of the system.

Figure 5:
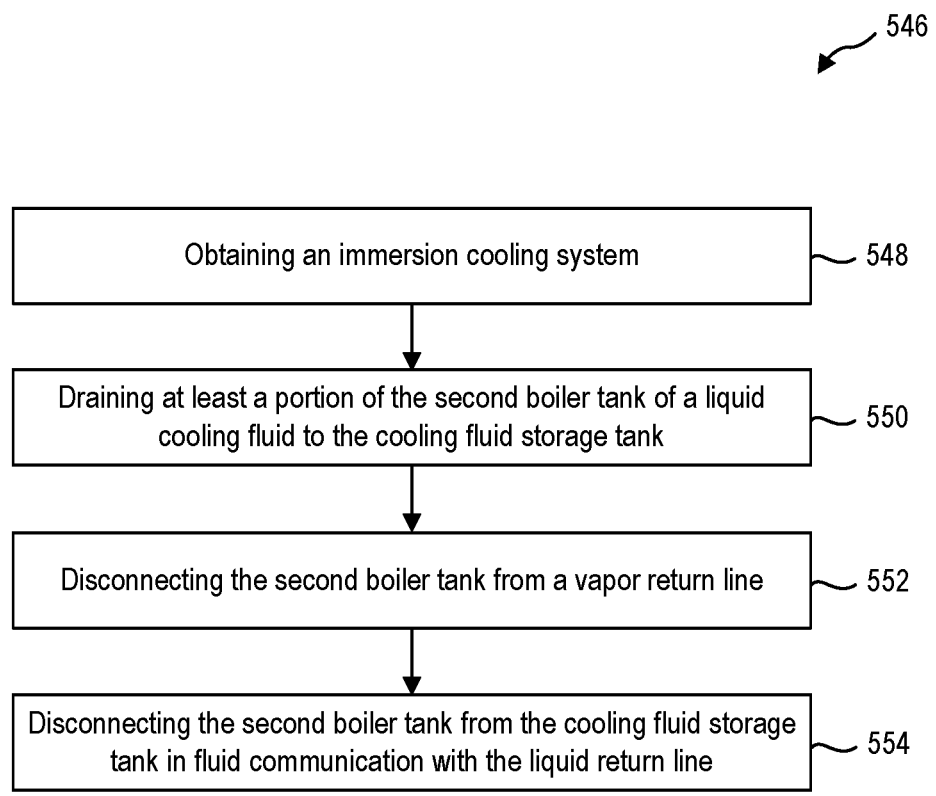
FIG. 5 is a flowchart illustrating a method of removing a boiler tank from an immersion cooling system with a plurality of boiler tanks, according to at least one embodiment of the present disclosure.
Figure 6:
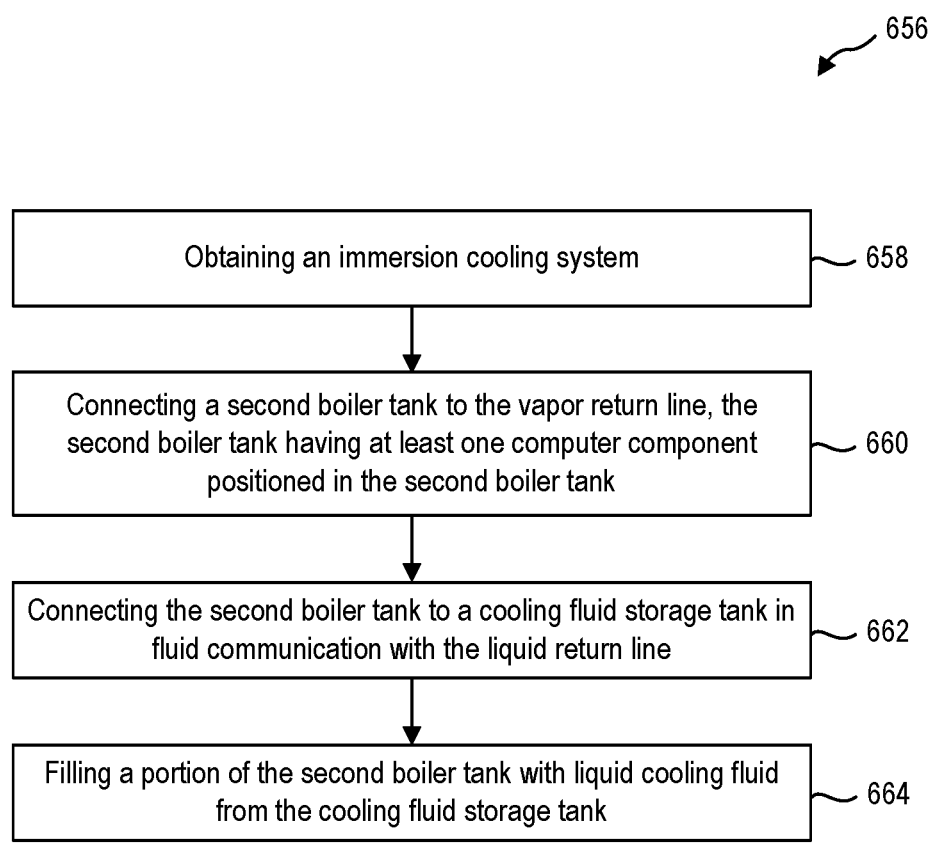
FIG. 6 is a flowchart illustrating a method of installing a boiler tank into an immersion cooling system with a plurality of boiler tanks, according to at least one embodiment of the present disclosure.

In some embodiments, such as illustrated in FIG. 5, a method 546 of removing a boiler tank from an immersion cooling system includes providing or obtaining (548) an immersion cooling system including at least one condenser connected to a first boiler tank and a second boiler tank by a vapor return line and by a liquid return line. In some embodiments, the method includes draining (550) at least a portion of the second boiler tank of a liquid cooling fluid to the cooling fluid storage tank. In some embodiments, the second boiler tank remains at least partially filled with cooling fluid upon disconnection from the vapor return line and/or the liquid return line. In some embodiments, ambient air or other non-condensable fluid is permitted to enter the second boiler tank upon disconnection from the vapor return line and/or the liquid return line. The method further includes disconnecting (552) the second boiler tank from the vapor return line and disconnecting (554) the second boiler tank from a cooling fluid storage tank that is in fluid communication with the liquid return line.

In some embodiments, upon disconnecting the second boiler tank from fluid communication with the vapor return line and/or the liquid return line, the method includes closing a vapor return line connection valve and/or a liquid return line connection valve, respectively. In some embodiments, the vapor return line connection valve and/or a liquid return line connection valve is closed automatically through the act of disconnecting the second boiler tank at the vapor connection and/or liquid connection. For example, the vapor return line connection valve and/or a liquid return line connection valve may be a contact valve that is actuated by the removal of a pin of the second boiler tank at the vapor connection and/or liquid connection.

In some embodiments, the vapor return line connection valve and/or a liquid return line connection valve is closed is a discrete act independently of connecting the second boiler tank at the vapor connection and/or liquid connection. For example, the vapor return line connection valve and/or a liquid return line connection valve may be a rotary valve that is actuated independently of connecting the vapor connection and/or liquid connection.

In some embodiments, a method 656 of installing a boiler tank into an immersion cooling system includes providing or obtaining (658) an immersion cooling system including at least one condenser connected to a first boiler tank by a vapor return line and by a liquid return line. The method further includes connecting (660) a second boiler tank to the vapor return line and connecting (662) the second boiler tank to a cooling fluid storage tank that is in fluid communication with the liquid return line.

In some embodiments, the method includes filling (664) at least a portion of the second boiler tank with liquid cooling fluid from the cooling fluid storage tank. In some embodiments, the second boiler tank is filled with ambient air upon connection to the vapor return line and/or the liquid return line (via the cooling fluid storage tank). In some embodiments, filling at least a portion of the second boiler tank includes purging air, vapor, or other gas from the second boiler tank through a non-condensable vent line connected to the condenser. In some embodiments, the second boiler tank is filled with cooling fluid upon connection to the vapor return line and/or the liquid return line (via the cooling fluid storage tank).

In some embodiments, after connecting the second boiler tank in fluid communication with the vapor return line and/or the liquid return line, the method includes opening a vapor return line connection valve and/or a liquid return line connection valve, respectively. In some embodiments, the vapor return line connection valve and/or a liquid return line connection valve is opened automatically through the act of connecting the second boiler tank at the vapor connection and/or liquid connection. For example, the vapor return line connection valve and/or a liquid return line connection valve may be a contact valve that is actuated by the encroachment of a pin of the second boiler at the tank vapor connection and/or liquid connection.

In some embodiments, the vapor return line connection valve and/or a liquid return line connection valve is opened is a discrete act independently of connecting the second boiler tank at the vapor connection and/or liquid connection. For example, the vapor return line connection valve and/or a liquid return line connection valve may be a rotary valve that is actuated independently of connecting the vapor connection and/or liquid connection.

Embodiments of a centralized and scalable immersion cooling system according to the present disclosure allow for changes in quantity of boiler tanks connected to the system while also improving redundancy and reliability in the operation of the condensers and thermal management capacity.

INDUSTRIAL APPLICABILITY

The present disclosure relates generally to systems and methods for thermal management of electronic devices or other heat-generating components. Immersion chambers surround the heat-generating components in a liquid cooling fluid, which conducts heat from the heat-generating components to cool the heat-generating components. As the cooling fluid absorbs heat from the heat-generating components, the temperature of the cooling fluid increases and the cooling fluid may vaporize, introducing vapor into the liquid of the cooling fluid.

An immersion cooling system according to the present disclosure includes a chamber with a cooling fluid positioned therein. The cooling fluid transitions between a liquid phase and a vapor phase to remove heat from hot or heat-generating components in the chamber. The liquid phase more efficiently receives heat from the components and, upon transition to the vapor phase, the cooling fluid can be cooled and condensed to extract the heat from the cooling fluid before the cooling fluid is returned to the liquid immersion bath at a lower temperature.

In some embodiments, the liquid immersion bath has a plurality of heat-generating components positioned in the liquid cooling fluid. The liquid cooling fluid surrounds the heat-generating components and other objects or parts attached to the heat-generating components. In some embodiments, the heat-generating components are positioned in the liquid cooling fluid on one or more supports. The support may support one or more heat-generating components in the liquid cooling fluid and allow the cooling fluid to move around the heat-generating components. In some embodiments, the support is thermally conductive to conduct heat from the heat-generating components. The support(s) may increase the effective surface area from which the cooling fluid may remove heat through convective cooling. In some embodiments, one or more of the heat-generating components includes a heat sink or other device attached to the heat-generating component to conduct away thermal energy and effectively increase the surface area of the heat-generating component.

As described, conversion of the liquid cooling fluid to a vapor phase requires the input of thermal energy to overcome the latent heat of vaporization and may be an effective mechanism to increase the thermal capacity of the cooling fluid and remove heat from the heat-generating components. Because the vapor rises in the liquid cooling fluid, the vapor phase can be extracted from the chamber in an upper vapor region of the chamber. A condenser cools part of the vapor of the cooling fluid back into a liquid phase, removing thermal energy from the system and reintroducing the cooling fluid into the liquid immersion bath. The condenser radiates or otherwise dumps the thermal energy from the cooling fluid into the ambient environment or into a conduit to carry the thermal energy away from the cooling system.

In conventional immersion cooling systems, the condenser is integrated into the boiler tank and/or the chamber to efficiently remove thermal energy from the cooling fluid. In some embodiments according to the present disclosure, a system for thermal management of computing devices allows a plurality of boiler tanks and/or chambers to be connected to and in fluid communication with an external condenser. In some embodiments, an immersion cooling system includes a vapor return line and a liquid return line that connect the boiler tank to the condenser and allow vapor cooling fluid to enter the condenser from the boiler tank and/or chamber and allow liquid cooling fluid to return to the boiler tank and/or chambers. In some embodiments, a plurality of boiler tanks is connected to a shared vapor return line and/or shared liquid return line, which are in turn connected to a shared condenser, providing redundancy and scalability in the immersion capacity of the cooling system. In some embodiments, the vapor return line and liquid return line are connected to a plurality of condensers, providing redundancy and scalability in the condensing capacity of the cooling system.

In some embodiments, the cooling fluid receives heat in a cooling volume of cooling fluid immediately surrounding the heat-generating components. The cooling volume is the region of the cooling fluid (including both liquid and vapor phases) that is immediately surrounding the heat-generating components and is responsible for the convective cooling of the heat-generating components. In some embodiments, the cooling volume is the volume of cooling fluid within 5 millimeters (mm) of the heat-generating components. In some embodiments, the cooling volume is the volume of cooling fluid within 5 mm of the vertical stacks (supports and heat-generating components). In some embodiments, the cooling volume is defined by a vertical cylinder around each of the vertical stacks where no portion of the cylinder is within 5 mm of the heat-generating components.

The cooling fluid has a boiling temperature below a critical temperature at which the heat-generating components experience thermal damage. For example, the heat-generating components may be computing components that experience damage above 100° Celsius (C). In some embodiments, the boiling temperature of the cooling fluid is less than a critical temperature of the heat-generating components. In some embodiments, the boiling temperature of the cooling fluid is less than about 90° C. In some embodiments, the boiling temperature of the cooling fluid is less than about 80° C. In some embodiments, the boiling temperature of the cooling fluid is less than about 70° C. In some embodiments, the boiling temperature of the cooling fluid is less than about 60° C. In some embodiments, the boiling temperature of the cooling fluid is at least about 35° C. In some embodiments, the cooling fluid includes water. In some embodiments, the cooling fluid includes glycol. In some embodiments, the cooling fluid includes a combination of water and glycol. In some embodiments, the cooling fluid is an aqueous solution. In some embodiments, the cooling fluid is an electronic liquid, such as FC-72 available from 3M, or similar non-conductive fluids. In some embodiments, the heat-generating components, supports, or other elements of the immersion cooling system positioned in the cooling fluid have nucleation sites on a surface thereof that promote the nucleation of vapor bubbles of the cooling fluid at or below the boiling temperature of the cooling fluid.

In embodiments of immersion cooling systems with heat-generating components including computing components, similar computing components can be aggregated into stacks or series. For example, a first series of heat-generating components may be graphical processing units (GPUs) and a second series of heat-generating components may be central processing units (CPUs). In other examples, a first immersion cooling system houses GPUs and a second immersion cooling system houses CPUs.

In some embodiments, similar computing components can be aggregated into individual boiler tanks. For example, a first boiler tank may contain graphical processing units (GPUs) and a second boiler tank may contain central processing units (CPUs). The first boiler tank and the second boiler tank may be connected to and in fluid communication with the shared vapor return line and/or shared liquid return line.

In some embodiments, the cooling fluid is therefore shared between each of the boiler tanks in the immersion cooling system. The vapor cooling fluid from each of the boiler tanks is provided to the condenser(s) via the vapor return line. In some embodiments, the condenser(s) is a solid-state condenser, such as a Peltier cooler. In some embodiments, the condenser uses a second cooling fluid to cool the coils or other cooling surface of the condenser. For example, a condenser has a refrigerant intake line and a refrigerant outlet line that cool an interior space of the condenser. The condenser cools the vapor cooling fluid to condense the cooling fluid into the liquid phase, which is subsequently returned to the boiler tanks. In some embodiments, the second cooling fluid includes water. In some embodiments, the second cooling fluid includes glycol. In some embodiments, the second cooling fluid includes a combination of water and glycol. In some embodiments, the second cooling fluid is an aqueous solution.

In some embodiments, the external condenser(s) allows the removal, addition, movement, repair, or replacement of a first boiler tank without affecting the operation of a second boiler tank. In some embodiments, the removal, addition, movement, repair, or replacement of the first boiler tank uses a cooling fluid storage tank. The cooling fluid storage tank can temporarily hold and/or selectively dispense cooling fluid to one or more boiler tanks. In some embodiments, a boiler tank is drained into the cooling fluid storage tank and/or the cooling fluid storage tank can withhold dispensing cooling fluid to a boiler tank to allow draining of the boiler tank. The drained boiler tank can be subsequently disconnected from the vapor return line and the liquid return line to remove the boiler tank from the immersion cooling system without interfering with or compromising the operation of other boiler tanks in the immersion cooling system.

In some embodiments, the cooling fluid storage tank stores cooling fluid that may be dispensed to a boiler tank when the boiler tank is connected to the vapor return line and liquid return line to add the boiler tank to the immersion cooling system without interfering with or compromising the operation of other boiler tanks in the immersion cooling system. In some embodiments, the cooling fluid storage tank can receive and temporarily hold cooling fluid from a boiler tank while the boiler tank is moved, repaired, or replaced, and the cooling fluid storage tank can return the liquid cooling fluid to the boiler tank after movement, repair, or replacement is complete.

In some embodiments, the storage tank is positioned in fluid communication with both the liquid return line from the condenser(s) and the plurality of boiler tanks. The storage tank may be connected in fluid communication in parallel with the boiler tanks to receive overflow cooling fluid during removal, addition, movement, repair, or replacement of boiler tanks. In some embodiments, the storage tank is connected in fluid communication in series between the condenser(s) and the boiler tanks in the liquid return line.

In some embodiments, the immersion cooling system is a closed circulation system in which only cooling fluid (in either vapor or liquid phase) is contained in the boiler tanks, vapor return line, liquid return line, condenser(s), and cooling fluid storage tank. During the removal, addition, movement, repair, or replacement of a boiler tank, non-condensable fluid (such as air) may be introduced into the immersion cooling system. It should be understood that a non-condensable fluid is a fluid that is not condensable at or near room temperature and pressure. For example, while nitrogen can be condensed into a liquid phase, such condensation will not occur until −196° C., and as such would be considered non-condensable in the present system. In some embodiments, a non-condensable fluid is any fluid that condenses below the condensation temperature of the cooling fluid.

In some embodiments, a non-condensable vent line is in fluid communication with condenser(s) to allow the non-condensable fluid to vent from the system. In some embodiments, the vapor cooling fluid is denser than a non-condensable fluid in the condenser. The non-condensable fluid rises relative to the vapor cooling fluid and is separated from the vapor cooling fluid. The non-condensable fluid is removed via the non-condensable vent line.

In some embodiments, the non-condensable vent line includes a filter in the non-condensable vent line prior to an outlet. The filter can prevent impurities or pollutants, such as particulates, from being exhausted from the outlet. In some embodiments, the non-condensable vent line includes a vent line condenser that operates at a lower temperature than the condenser(s) of the immersion cooling system. In the event that a portion of the vapor cooling fluid in not condensed in the condenser(s) 306-1, 306-2, the vent line condenser can, therefore, condense at least a portion of the uncondensed vapor cooling fluid and limit and/or prevent cooling fluid from being exhausted from the outlet 332.

In some embodiments, an immersion cooling system includes a plurality of boiler tanks and a plurality of condensers. In some embodiments, an immersion cooling system includes a different quantity of boiler tanks than condensers. In some embodiments, an immersion cooling system includes more boiler tanks than condensers, providing greater efficiency by condensing the vapor cooling fluid of the boiler tanks with relatively fewer condensers. In some embodiments, an immersion cooling system includes more condensers than boiler tanks, providing redundancy by ensuring condensing capacity is not adversely affected by a failure of a condenser. In some embodiments, an immersion cooling system includes a quantity of condensers equal to the quantity of boiler tanks plus one extra condenser to provide backup capacity. An immersion cooling system with redundant condenser capacity on a shared vapor return line and/or shared liquid return line may maintain condenser capacity in the event of a condenser failure irrespective of which condenser fails.

In some embodiments, the shared vapor return line and/or shared liquid return line include a plurality of valves at or near a connection to the plurality of boiler tanks. The valves may allow a connection to a boiler tank to be closed prior to the removal, addition, movement, repair, or replacement of the boiler tank. By closing the connection(s) to the boiler tank before removal, addition, movement, repair, or replacement of a boiler tank, the likelihood of introducing non-condensable vapor or other contaminants into the vapor return line, liquid return line, or other portions of the immersion cooling system is reduced.

In some embodiments, a vapor connection of the vapor return line to the boiler tank includes a vapor return line connection valve. The vapor return line connection valve regulates a flow of vapor cooling fluid from a boiler tank to the vapor return line. In some embodiments, each vapor connection of the vapor return line has a vapor return line connection valve. Closing the vapor return line connection valve limits and/or prevents the flow of vapor cooling fluid from the vapor connection to the vapor return line. After closing the vapor return line connection valve, a boiler tank can be removed while introducing less or no non-condensable fluid into the vapor return line.

In some embodiments, a liquid connection of the liquid return line to the boiler tank includes a liquid return line connection valve. The liquid return line connection valve regulates a flow of liquid cooling fluid from the liquid return line to the boiler tank. In some embodiments, each liquid connection of the liquid return line has a liquid return line connection valve. Closing the liquid return line connection valve limits and/or prevents the flow of liquid cooling fluid from the liquid connection to the liquid return line. After closing the liquid return line connection valve, a boiler tank can be removed while allowing less or no cooling fluid to flow from the liquid return line.

In some embodiments, a cooling fluid storage tank connection of the liquid return line to the cooling fluid storage tank includes a storage tank connection valve. The storage tank connection valve regulates a flow of liquid cooling fluid from the storage tank to the boiler tank. In some embodiments, each cooling fluid storage tank connection of the storage tank has a storage tank connection valve. Closing the storage tank connection valve limits and/or prevents the flow of liquid cooling fluid from the storage tank connection to the liquid return line. After closing the storage tank connection valve, a storage tank can be removed while allowing less or no cooling fluid to flow from the liquid return line.

In some embodiments, an immersion cooling system according to the present disclosure allows the removal, addition, movement, repair, or replacement of a boiler tank and/or a condenser from the system without adversely impacting other components. In some embodiments, the removal, addition, movement, repair, or replacement of a boiler tank can be performed without altering the operation of any of the condensers of the system.

In some embodiments, a method of removing a boiler tank from an immersion cooling system includes providing or obtaining an immersion cooling system including at least one condenser connected to a first boiler tank and a second boiler tank by a vapor return line and by a liquid return line. In some embodiments, the method includes draining at least a portion of the second boiler tank of a liquid cooling fluid to the cooling fluid storage tank. In some embodiments, the second boiler tank remains at least partially filled with cooling fluid upon disconnection from the vapor return line and/or the liquid return line. In some embodiments, ambient air or other non-condensable fluid is permitted to enter the second boiler tank upon disconnection from the vapor return line and/or the liquid return line. The method further includes disconnecting the second boiler tank from the vapor return line and disconnecting the second boiler tank from a cooling fluid storage tank that is in fluid communication with the liquid return line.

In some embodiments, upon disconnecting the second boiler tank from fluid communication with the vapor return line and/or the liquid return line, the method includes closing a vapor return line connection valve and/or a liquid return line connection valve, respectively. In some embodiments, the vapor return line connection valve and/or a liquid return line connection valve is closed automatically through the act of disconnecting the second boiler tank at the vapor connection and/or liquid connection. For example, the vapor return line connection valve and/or a liquid return line connection valve may be a contact valve that is actuated by the removal of a pin of the second boiler tank at the vapor connection and/or liquid connection.

In some embodiments, the vapor return line connection valve and/or a liquid return line connection valve is closed is a discrete act independently of connecting the second boiler tank at the vapor connection and/or liquid connection. For example, the vapor return line connection valve and/or a liquid return line connection valve may be a rotary valve that is actuated independently of connecting the vapor connection and/or liquid connection.

In some embodiments, a method of installing a boiler tank into an immersion cooling system includes providing or obtaining an immersion cooling system including at least one condenser connected to a first boiler tank by a vapor return line and by a liquid return line. The method further includes connecting a second boiler tank to the vapor return line and connecting the second boiler tank to a cooling fluid storage tank that is in fluid communication with the liquid return line.

In some embodiments, the method includes filling at least a portion of the second boiler tank with liquid cooling fluid from the cooling fluid storage tank. In some embodiments, the second boiler tank is filled with ambient air upon connecting to the vapor return line and/or the liquid return line (via the cooling fluid storage tank). In some embodiments, filling at least a portion of the second boiler tank includes purging air, vapor, or other gas from the second boiler tank through a non-condensable vent line connected to the condenser. In some embodiments, the second boiler tank is filled with cooling fluid upon connection to the vapor return line and/or the liquid return line (via the cooling fluid storage tank).

In some embodiments, after connecting the second boiler tank in fluid communication with the vapor return line and/or the liquid return line, the method includes opening a vapor return line connection valve and/or a liquid return line connection valve, respectively. In some embodiments, the vapor return line connection valve and/or a liquid return line connection valve is opened automatically through the act of connecting the second boiler tank at the vapor connection and/or liquid connection. For example, the vapor return line connection valve and/or a liquid return line connection valve may be a contact valve that is actuated by the encroachment of a pin of the second boiler at the tank vapor connection and/or liquid connection.

In some embodiments, the vapor return line connection valve and/or a liquid return line connection valve is opened is a discrete act independently of connecting the second boiler tank at the vapor connection and/or liquid connection. For example, the vapor return line connection valve and/or a liquid return line connection valve may be a rotary valve that is actuated independently of connecting the vapor connection and/or liquid connection.

Embodiments of a centralized and scalable immersion cooling system according to the present disclosure allow for changes in quantity of boiler tanks connected to the system while also improving redundancy and reliability in the operation of the condensers and thermal management capacity.

The present disclosure relates to systems and methods for cooling heat-generating components of a computer or computing device according to at least the examples provided in the sections below:

1. A thermal management system comprising:
   a boiler tank;
   at least one heat-generating component positioned in the boiler tank;
   a vapor return line in fluid communication with the boiler tank;
   a liquid return line in fluid communication with the boiler tank; and
   a condenser in fluid communication with the vapor return line and the liquid return line and positioned between the vapor return line and the liquid return line in the fluid communication.

2. The thermal management system of section 1 further comprising a second boiler tank in fluid communication with the vapor return line and the liquid return line.

3. The thermal management system of section 2 further comprising a second condenser in fluid communication with the vapor return line and the liquid return line.

4. The thermal management system of any preceding section further comprising a cooling fluid storage tank in fluid communication with the boiler tank and the liquid return line and positioned between the boiler tank and the liquid return line in the fluid communication.

5. The thermal management system of any preceding section further comprising a liquid cooling fluid in the boiler tank, wherein the heat-generating components are configured to heat the liquid cooling fluid.

6. The thermal management system of section 5, wherein the cooling fluid has a boiling point less than 60° Celsius.

7. The thermal management system of any preceding section, wherein the condenser is a liquid-cooled condenser.

8. The thermal management system of any preceding section further comprising a non-condensable vent line in fluid communication with the condenser.

9. The thermal management system of section 8 wherein the non-condensable vent line is in fluid communication with a filter.

10. The thermal management system of sections 8 or 9 wherein the non-condensable vent line is further in fluid communication with the vapor return line.

11. The thermal management system of any preceding section further comprising a vapor connection valve between the vapor return line and the boiler tank.

12. The thermal management system of any preceding section, wherein there is no condenser in the boiler tank.

13. The thermal management system of any preceding section further comprising a plurality of boiler tanks in fluid communication with the vapor return line and a plurality of condensers in fluid communication with the vapor return line, wherein a quantity of condensers is not a multiple of a quantity of boiler tanks.

14. A method of installing a thermal management system for computing devices, the method comprising:
   providing the thermal management system of section 1;
   connecting a second boiler tank to the vapor return line, the second boiler tank having at least one heat-generating component positioned in the second boiler tank;
   connecting the second boiler tank to a cooling fluid storage tank in fluid communication with the liquid return line; and
   filling a portion of the second boiler tank with liquid cooling fluid from the cooling fluid storage tank.

15. The method of section 14, wherein filling a portion of the second boiler tank includes purging air from the second boiler tank through a non-condensable vent line.

16. The thermal management system of claim 1, further comprising:
   a second boiler tank in fluid communication with the vapor return line and the liquid return line; and
   a cooling fluid storage tank in fluid communication with the boiler tank and the liquid return line and positioned between the boiler tank and the liquid return line in the fluid communication,
   wherein the liquid return line between the cooling fluid storage tank and the first boiler tank and second boiler tank maintains the fluid level in the boiler from the recovered fluid from the condensers.

17. The thermal management system of claim 1 further comprising a fluid filter on a drain line to clean fluid from the boiler tank and return the fluid through a liquid return line.

18. The thermal management system of claim 1, further comprising a liquid collection line in fluid communication with the vapor return line to return any condensed fluid to the tank for return to the system.

19. The thermal management system of claim 1, wherein the vapor return line is oriented at a non-perpendicular angle to a direction of gravity to allow any condensed fluid to return to either the boiler or condenser.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system comprising an immersion cooling system for computing components comprising:
    a boiler tank;
    at least one heat-generating component positioned in the boiler tank;
    a vapor return line in fluid communication with the boiler tank;
    a liquid return line in fluid communication with the boiler tank;
    a cooling fluid storage tank in liquid communication with the boiler tank and the liquid return line and positioned between the boiler tank and the liquid return line in the liquid communication;
    a condenser in fluid communication with the vapor return line and the liquid return line and positioned between the vapor return line and the liquid return line in the fluid communication; and
    a connectable second boiler tank in fluid communication with the vapor return line and the liquid return line.

2. The thermal management system of claim 1 further comprising a second condenser in fluid communication with the vapor return line and the liquid return line.

3. The thermal management system of claim 1 further comprising a liquid cooling fluid in the boiler tank, wherein the heat-generating components are configured and positioned to heat the liquid cooling fluid.

4. The thermal management system of claim 3, wherein the cooling fluid has a boiling point less than 60° Celsius.

5. The thermal management system of claim 1, wherein the condenser is a liquid-cooled condenser.

6. The thermal management system of claim 1 further comprising a non-condensable vent line in fluid communication with the condenser to allow non-condensable fluid to vent from the system.

7. The thermal management system of claim 6 wherein the non-condensable vent line is in fluid communication with a filter.

8. The thermal management system of claim 6 wherein the non-condensable vent line is further in fluid communication with the vapor return line.

9. The thermal management system of claim 1 further comprising a vapor connection valve between the vapor return line and the boiler tank.

10. The thermal management system of claim 1, wherein there is no condenser in the boiler tank.

11. The thermal management system of claim 1 further comprising a plurality of boiler tanks in fluid communication with the vapor return line and a plurality of condensers in fluid communication with the vapor return line, wherein the number of condensers in the plurality of condensers is not the same as the number of boiler tanks in the plurality of boiler tanks.

12. A method of installing a thermal management system for computing devices, the method comprising:
    providing the thermal management system of claim 1;
    connecting the second boiler tank to the vapor return line, the second boiler tank having at least one heat-generating component positioned in the second boiler tank;
    connecting the second boiler tank to the cooling fluid storage tank in fluid communication with the liquid return line, the cooling fluid storage tank in fluid communication with the boiler tank and the liquid return line and positioned between the boiler tank and the liquid return line in the fluid communication; and
    filling a portion of the boiler tank with liquid cooling fluid from the cooling fluid storage tank.

13. The method of claim 12, wherein filling a portion of the boiler tank includes purging air from the boiler tank through a non-condensable vent line.

14. The method of section 12, wherein filling a portion of the second boiler tank includes purging air from the second boiler tank through a non-condensable vent line.

15. The thermal management system of section 1, further comprising a second boiler tank in fluid communication with the vapor return line and the liquid return line.

16. The thermal management system of claim 1, further comprising:
    a second boiler tank in fluid communication with the vapor return line and the liquid return line; and
    a cooling fluid storage tank in fluid communication with the boiler tank and the liquid return line and positioned between the boiler tank and the liquid return line in the fluid communication, wherein the liquid return line between the cooling fluid storage tank and the first boiler tank and second boiler tank maintains the fluid level in the boiler from the recovered fluid from the condensers.

17. The thermal management system of claim 1 further comprising a fluid filter on a drain line to clean fluid from the boiler tank and return the fluid through a liquid return line.

18. The thermal management system of claim 1, further comprising a liquid collection line in fluid communication with the vapor return line to return any condensed fluid to the tank for return to the system.

19. The thermal management system of claim 1, wherein the vapor return line is oriented at a non-perpendicular angle to a direction of gravity to allow any condensed fluid to return to either the boiler or condenser.

20. A method of installing a thermal management system for computing devices, the method comprising:
providing a thermal management system including:
a boiler tank;
at least one heat-generating component positioned in the boiler tank, the boiler tank in fluid communication with a vapor return line and a liquid return line;
a condenser is in fluid communication with the vapor return line and the liquid return line and positioned between vapor return line and the liquid return line in the fluid communication;
connecting a second boiler tank to the vapor return line, the second boiler tank having at least one heat-generating component positioned in the second boiler tank;
connecting the second boiler tank to a cooling fluid storage tank in fluid communication with the liquid return line; and
filling a portion of the boiler tank with liquid cooling fluid from the cooling fluid storage tank.

* * * * *